US005574751A

United States Patent [19]

Trelewicz

[11] Patent Number: 5,574,751
[45] Date of Patent: Nov. 12, 1996

[54] METHOD FOR A SOFT-DECISION MODULATION SYSTEM

[75] Inventor: Jennifer Trelewicz, Mesa, Ariz.

[73] Assignee: Motorola, Inc., Schaumburg, Ill.

[21] Appl. No.: 427,335

[22] Filed: Apr. 24, 1995

[51] Int. Cl.[6] .............................. H03M 13/12; H04L 1/00
[52] U.S. Cl. ......................... 375/265; 375/262; 375/341; 371/43
[58] Field of Search ................................. 375/262, 265, 375/341; 371/43; 364/737

[56] References Cited

U.S. PATENT DOCUMENTS

| | | | |
|---|---|---|---|
| 4,979,175 | 12/1990 | Porter | 371/43 |
| 5,128,967 | 7/1992 | Durkin et al. | 375/83 |
| 5,144,644 | 9/1992 | Borth | 375/341 |
| 5,208,816 | 5/1993 | Seshadri et al. | 371/43 |
| 5,375,129 | 12/1994 | Cooper | 371/43 |
| 5,471,500 | 11/1995 | Blaker et al. | 371/43 |

FOREIGN PATENT DOCUMENTS 4-88726  3/1992  Japan ............................. 371/43

*Primary Examiner*—Stephen Chin
*Assistant Examiner*—Jeffrey W. Gluck
*Attorney, Agent, or Firm*—Frank J. Bogacz

[57] ABSTRACT

A soft-decision modulation system (10) has a transmitter (11) and a receiver (21). The transmitter encodes (68), modulates (72) and transmits (74–78) a data stream. The receiver receives the modulated data stream and recovers symbols (86) representing the transmitted data stream. Data decoding (92) is performed with a trellis decoder with a soft-decision metric using a selected set of coefficients (90). The performance of the decoding step is evaluated (104). The coefficients are adjusted (108) until performance is acceptable. When performance is satisfactory the coefficients are installed (112) in the modulation system.

19 Claims, 3 Drawing Sheets

METHOD FOR A SOFT-DECISION MODULATION SYSTEM

GOVERNMENT LICENSE RIGHTS

The U.S. Government has a paid-up license in this invention and the right in limited circumstances to require the patent owner to license others on reasonable terms as provided for by the terms of contract No. MDA904-92-C-8082 awarded by the NSA.

BACKGROUND OF THE INVENTION

The present invention pertains to radio transmission systems and more particularly to a method for weighting the quality of data transmitted and received by a radio transmission system.

Data systems that are expected to operate in noisy or lossy channels can employ error correction techniques to attempt to correct errors in the received signal. One such error correction technique is trellis coding, a method of convolutional coding. Trellis coding encodes a block of data by using the data as inputs to a finite state machine, where constellation point pairs are output according to state transitions. Fixed entry and exit states are used for the encoding state machine. The receiving equipment uses knowledge of the state machine to build a trellis diagram. The trellis diagram depicts traces through the least-cost choice for each state transition corresponding to each constellation pair. The lowest-cost path through the trellis diagram, beginning at the fixed entry and exit states, is chosen for decoding the data block. The Viterbi algorithm is used for finding the lowest-cost path.

One method for determining the least-cost path is by using a Hamming distance in a hard-decision decoder. The Hamming distance is then used as the metric for transition cost in the path. Since the hard decision discards much of the information about the signal, the hard decision method is not suitable for some systems. This method has losses corresponding to the quantization of received signal to bits.

It would be highly desirable to have a method which works as a kind of distance function and makes use of phase and magnitude information from the radio receiver. It is further desirable to strengthen the Viterbi search and have fewer quantization losses.

DESCRIPTION OF THE PREFERRED EMBODIMENT

Figure 1:
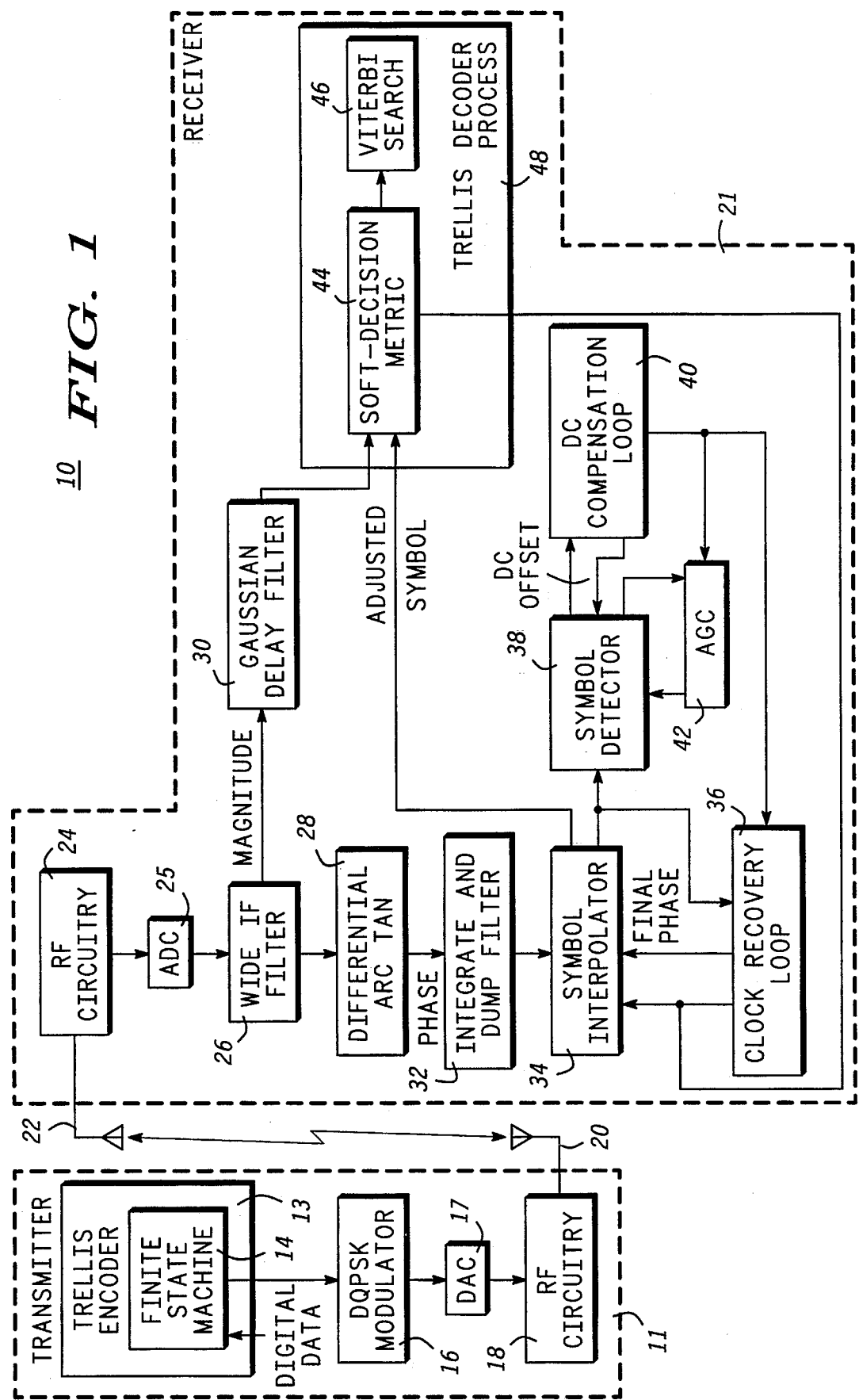
FIG. 1 is a block diagram of a radio system in accordance with the present invention.

Referring to FIG. 1, the transmitter 11 of a radio system 10 receives an input stream of digital data. The digital data may be encoded with some error correction code. A trellis encoder 13 includes a finite state machine 14 which maps the digital data to a series of constellation points.

A DQPSK modulator 16 determines the phase rotation of the transmission signal from the series of constellation points and produces in-phase and quadrature signals. The in-phase (I) and quadrature (Q) signals are passed through a digital-to-analog converter (DAC) 17 to convert the quadrature signals to analog form. RF circuitry 18 converts the analog form of the in-phase and quadrature signals for radio transmission via transmission antenna 20.

The radio receiver 21 includes a receiving antenna 22. Receiver 21 also includes RF circuitry 24 which drives an analog-to-digital converter 25 (ADC). The in-phase and quadrature portions of the sampled, quantized digital data are filtered by wide IF filter 26. The magnitude information from the output of wide IF filter 26 is transmitted to Gaussian delay filter 30.

From the output of wide IF filter 26, the differential arctangent (arctan) is computed for the phase information by arctan function 28. The differential arctangent is filtered by integrate and dump filter 32 to symbol interpolator 34.

Symbol interpolator 34, clock recovery loop 36, symbol detector 38, DC compensation loop 40 and Automatic Gain Control (AGC) 42 comprise the symbol recovery loop. The symbol interpolator 34 uses fine phase adjustment information from the clock recovery loop to interpolate linearly between samples to form each symbol.

The symbol recovery loop includes the DC compensation loop 40, which uses symbol quantization error to track the DC offset voltage of the symbol samples. The automatic gain control 42 (AGC) tracks the gain that is required to bring the samples to a level consistent with the quantization levels. The symbol detector 38 calculates the error that would occur were the symbol quantized to one of the constellation points, adjusting for DC and gain offsets. Finally, the clock recovery loop 36 tracks error and symbols to generate a data rate clock and the fine phase offset.

The magnitude of the quadrature signals is delayed by Gaussian delay filter 30 to match the adjusted symbol phase delay in the symbol recovery loop. The interpolated symbol from symbol interpolator 34 and the magnitude produced by Gaussian delay filter 30 are transmitted to soft-decision metric block 44 that converts the phase and magnitude information back into data bits. Soft-decision metric 44 and Viterbi search function 46 comprise trellis decoder processor 48. Trellis decoder processor 48 may comprise a processor such as the type C40 digital signal processor (DSP) manufactured by Texas Instruments. Two processors may be used in the preferred embodiment. Typical DSPs or Reduced Instruction Set Computers (RISC) processors will also as suitable processors.

Data systems that are expected to operate in noisy or lossy channels can employ error correction techniques to attempt to correct errors in the received signal. One such error correction technique is trellis coding, a method of convolutional coding. Trellis coding encodes a block of data by using the data as inputs to a finite state machine, where constellation point pairs are output according to state transitions. Fixed entry and exit states are used for the encoding state machine. The receiving equipment uses knowledge of the state machine to build a trellis diagram. The trellis diagram traces through the least-cost choice for each state transition corresponding to each constellation pair. The lowest-cost path through the trellis diagram, beginning at the fixed entry and exit states, is chosen for decoding the data block. The Viterbi algorithm is used for finding the lowest-cost path.

In a hard-decision decoder, the Hamming distance can be used as the metric for transition cost in the path. Since the hard-decision decoder discards much of the information about the signal, the hard-decision method is not suitable for some systems. In a soft-decision system, a soft-decision metric, working as a kind of distance function, makes use of phase and magnitude information from the receiver. The soft-decision metric makes the Viterbi search stronger because of fewer quantization losses.

In the receiving equipment 21 of the present invention, signal quality is incorporated into trellis decoding calculations through a soft-decision metric 44 built upon the multi-dimensional nature of the phase and magnitude information in the channel and any prior knowledge of the channel characteristics. This soft-decision metric 44 is intended for use in systems employing Viterbi searches for convolutional coding.

Distance constraints on constellation points $\pi/4$, $-\pi/4$, $3\pi/4$, $-3\pi/4$ on the unit circle were analyzed to create the metric, which will be called M, where (equation 1):

$$M\left(\frac{3\pi}{4}, -\frac{3\pi}{4}\right) = M\left(-\frac{3\pi}{4}, -\frac{\pi}{4}\right) =$$

$$M\left(\frac{\pi}{4}, -\frac{\pi}{4}\right) = M\left(\frac{3\pi}{4}, \frac{\pi}{4}\right)$$

$$M(i,j) = 0 \leftrightarrow (i = j) \vee (i = -\pi \wedge j = \pi) \vee (i = \pi \wedge j = -\pi)$$
$$M(i,j) \geq 0$$

$$|i - j| = \pi \leftrightarrow \frac{dM(i,j)}{d(i-j)} = 0$$

For a constellation point $e^{p_0}$ and a sample point $m_1 e^{p_1}$, the soft-decision metric 44 was designed to be symmetric about the line where the sample phase $p_1$ and the constellation phase $p_0$ are equal, in the $p_0$–$p_1$ plane. The metric was built on polynomials for computational efficiency.

The distance constraints translate into the following constraints on M, (equation 2) with arbitrary constants A and B:

$$x = \frac{8(p_1 - p_0)^2}{\pi^2}$$

$$(x = 0) \vee (x = 32) \leftrightarrow M(x) = 0$$
$$x = 8 \leftrightarrow M(x) = A$$

$$\left(x = \frac{1}{2}\right) \vee (x = 18) \rightarrow M(x) = B, A > B > 0$$

Constraints on the metric translate into the following constraints (equation 3) on M:

$$M(x) \geq 0, x \in [0, 32]$$

$$\frac{d}{dx} M(x) \geq 0, x \in [0, 8]$$

$$\frac{d}{dx} M(x) \leq 0, x \in [8, 32]$$

An eighth-order polynomial in x was found to work best. For 6 parameters $a_n$, selected off-line, the resulting metric is the following (equation 4):

$$M(x, m_1) = \begin{cases} Gm_1 x(x - 32) \prod_{n=0}^{5} (x - a_n), & m_1 \neq 0 \\ A, & m_1 = 0 \end{cases}$$

define $$\alpha(b_0, b_1, b_2, b_3, b_4, b_5) = b_0 \pi\, a_i = b_i \sum_{i \neq j \neq k \neq l} a_i a_j a_k a_l - b_5 +$$

$$b_2 \sum_{i \neq j \neq k} a_i a_j a_k - b_3 \sum_{i \neq j} a_i a_j + b_4 \Sigma a_i$$

-continued $$a_0(a_1, a_2, a_3, a_4, a_5) = \frac{1}{2} \frac{\alpha(3680, 66352, 1194392, 21499084, 386983526, 6965703475)}{\alpha(96, 1840, 33176, 597196, 10749542, 193491763)}$$

also, $$a_0(a_1, a_2, a_3, a_4, a_5) = 4 \frac{\alpha(5, 64, 704, 7168, 69632, 655360)}{\alpha(1, 20, 256, 2816, 28672, 278528)}$$

The gain, G, is chosen so that M is non-negative in the specified range and so that the M metric does not become large enough to cause loss of precision during addition in the trellis decoding process.

Figure 2:
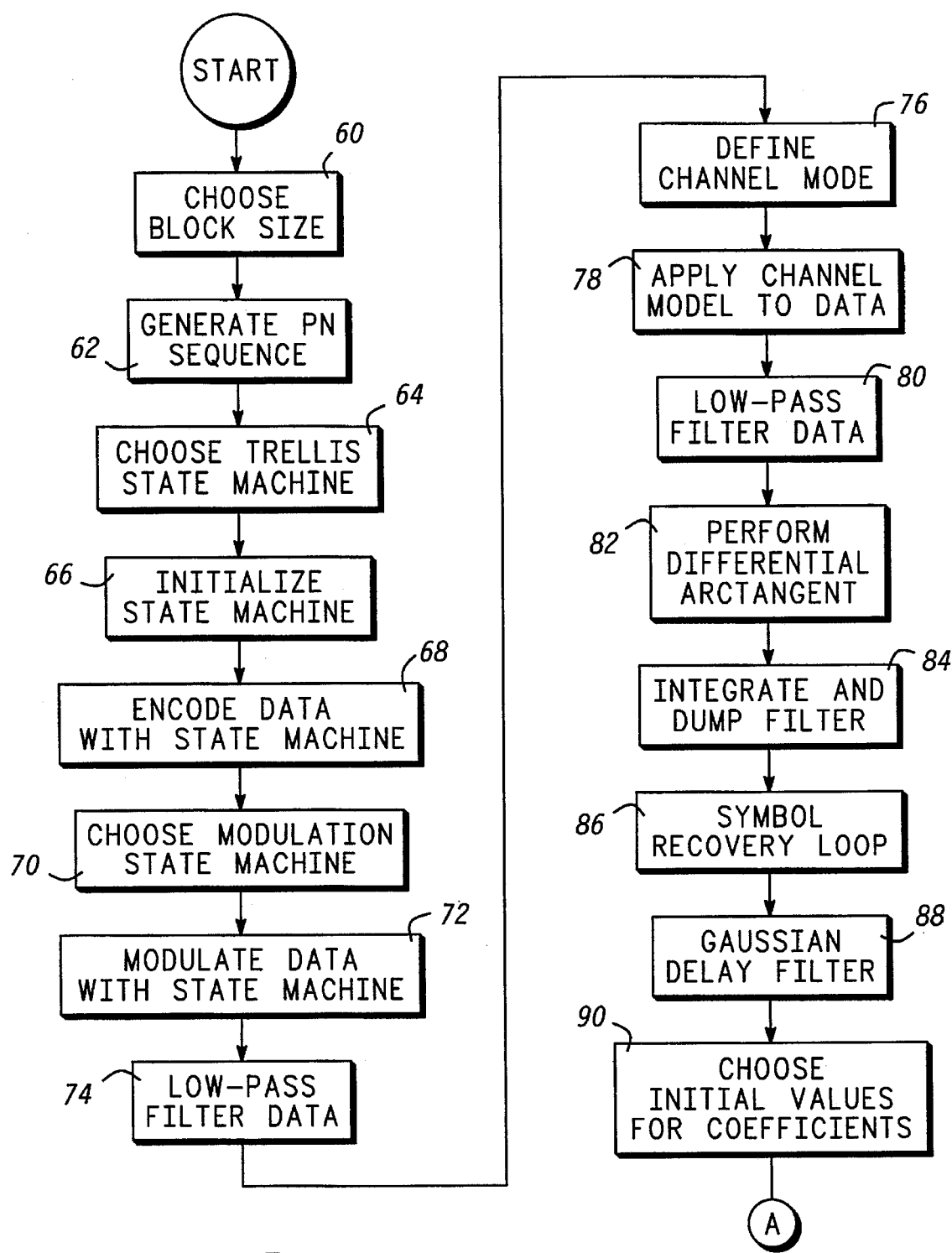
FIG. 2 is a flow chart of a soft-decision method in accordance with the present invention.

A method for choosing coefficients for the soft-decision modulation system metric is shown in FIG. 2. A test digital data sequence is generated, block 60. The test data may be "spread" with a pseudo-noise data sequence to ensure bit transitions. The block size (number of bits per trellis block encoded) is chosen. The block size is dependent on the application. A PN data sequence is generated as the bit outputs of a pseudo-noise (PN) code generator to ensure bit transitions block 62. (Original data used in the system might be added to the PN sequence or to alternating ones and zeroes to ensure bit transitions.) The PN sequence of bits is stored in a computer data file (not shown).

The trellis state machine is chosen to correspond to the particular application, block 64. The state machine must have exactly one state transition for each possible input. The state machine 14 is initialized to state zero, block 66. The test data is transmitted to the finite state machine 14 of trellis encoder 13. The state machine must have exactly one state transition for each constellation point used in modulation. The data are encoded by the trellis state machine, block 68. The input data are used as the state transitions for the state machine. The constellation pair associated with each state transition is the trellis output for the input data sequence. Constellation points in the pairs may be represented as integers (e.g., $-3, -1, 1, 3$).

DQPSK modulator 16 operates on the data to perform the modulation. A modulation state machine is chosen for the particular application, block 70. The state machine transitions correspond to in-phase (I) and quadrature (Q) portions of the phase rotation of the output signal. One state transition is made for each constellation point. The input data also determine the next state in the state machine. The data is modulated with the state machine, block 72. The input data are used to transition through the state machine to generate the I and Q portions of the output signal.

The modulated data are stored in a computer data file (not shown). DAC 17 converts the data to analog form. A modified raised cosine filter, included in the RF circuitry 18, is used to low-pass filter the modulated data, block 74. RF circuitry 18 transmits the converted data via transmit antenna 20 to receive antenna 22.

In a simulation system, channel effects may be simulated on the received digital samples. A channel model may be defined, based on the application. The channel model may include noise, fading, specific interfering signals, or other spectral effects, block 76. In a physical system, noise, fading, specific interfering signals and other spectral effects are automatically present. The channel model is applied to each modulated datum as a series of filters which simulate the channel effects, block 78. The output of the channel simulator is saved in a computer file.

At block 80 the transmitted data is collected, low-pass filtered, converted to binary data and stored. A differential arctangent function is used on the received data to undo the differential effects of the modulation, block 82. For current samples $I_n$ and $Q_n$ and the previous samples $I_{n-1}$ and $Q_{n-1}$ the differential arctangent function is as follows:

$$ARCTAN(Q_n/I_n)-ARCTAN(Q_{n-1}/I_{n-1})$$

An integrate and dump filter 32 filters the output of the differential arctangent function, block 84.

The symbol recovery loop is performed, block 86, including symbol interpolator 34, a DC compensation loop 40, an AGC loop 42, a symbol detector 38, and a clock recovery loop 36. The DC compensation loop 40 uses symbol quantization error to track the DC offset of the samples. The AGC loop 42 tracks the gain that is required to bring the samples to a level consistent with the quantization levels. The symbol detector 38 calculates the error that would occur were the symbol quantized to one of the constellation points, adjusting for DC and gain offsets. Finally, the clock recovery loop 36 tracks error and symbols to generate a data clock and the fine phase offset. Block 88 determines the magnitude of the delay of the quadrature signals by a Gaussian delay filter 30 and matches the adjusted symbol phase delay in the symbol recovery loop.

Next block 90 chooses the initial values of the metric coefficients. Initial values for $a_2$, $a_3$, $a_4$ and $a_5$ are arbitrarily chosen. The values of coefficients $a_0$, $a_1$ and G are chosen to satisfy the constraints in equations 2, 3 and 4.

Figure 3:
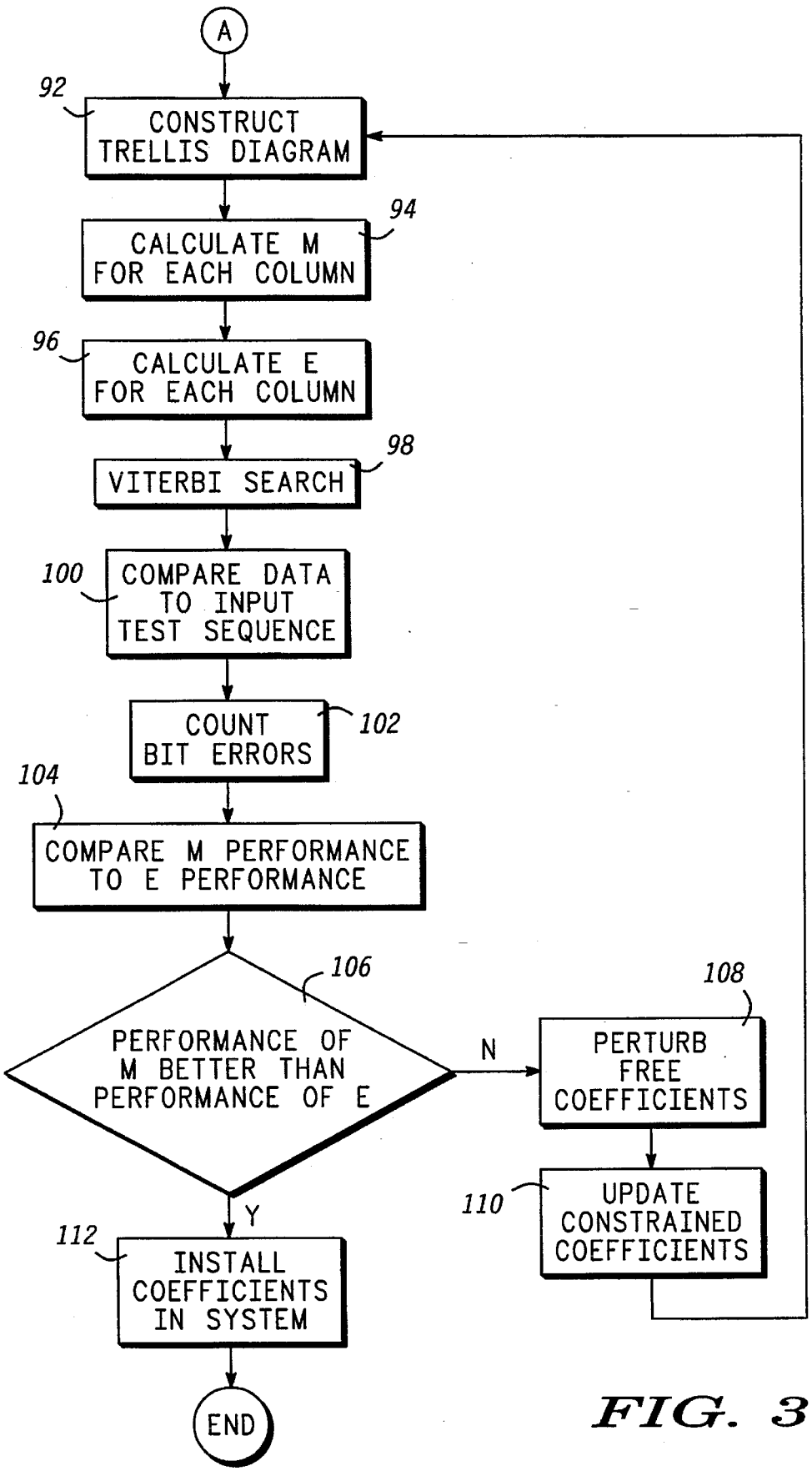
FIG. 3 is a flow chart of a soft-decision method in accordance with the present invention.

Continuing in FIG. 3, a table representing a trellis diagram is constructed for the data, block 92. One row in the table is created for each state in the trellis state machine. One column is created in the table for each constellation pair of datum and for the starting state (zero). The M metric is calculated for each state transition and is used to quantify the cost of each state transition in the trellis diagram. For each column in the table, the metric is used to find the "distance" between the column's demodulated datum and the constellation pair which corresponds to each state transition in the column, block 94. The metric E is defined as a one dimensional distance between a constellation point at phase $p_0$ and an input point at phase $p_1$ and magnitude $m_1$: $m_1(p_0-p_1)$. The E metric is calculated for each state transition and is used to quantify the cost of each state transition in the trellis diagram, block 96. A Viterbi search by Viterbi search function 46 is used to traverse the least-cost path in the trellis diagram from its end state (zero) to its start state (zero), block 98.

The decoded data are compared to the test data sequence, block 100. The number of bits which differ between the test sequence and the decoded sequence are counted. The number of bits which differ is divided by the block size to calculate the percentage of bit errors, Block 102. The performance of M is compared to that of the baseline, E, Block 104. If the performance with the current set of coefficients is not sufficient (M<E), block 106, control is transferred to block 108 where the free coefficients ($a_2$, $a_3$, $a_4$ and $a_5$) are perturbed (changed by a small value for each degree of freedom). The constrained coefficients ($a_0$, $a_1$ and G) are updated, block 110. Then the above process is iterated, beginning at step 92. Through the perturbation of coefficients, the iterative process is considered to be converged when a set of coefficients with sufficient performance against the E metric, or when a global or local maximum for performance, is found.

The performance of the soft-decision modulation system metric (i.e. BER) is evaluated. The performance (i.e. BER) of the soft-decision metric, M, is compared to the minimum system performance, E, block 106. The minimum performance criterion selected for the system is system dependent. The criterion may be a percentage increase over the performance of the Euclidean metric, for example. If the system performance is acceptable (M>E), block 106 transfers control to block 112 via the Y path. Block 112 then installs the current set of coefficients ($a_0$, $a_1$, $a_2$, $a_3$, $a_4$, $a_5$ and G) in the system to be used for data reception and decoding.

The M metric is suitable for M-ary constellation clusters received from a modem. The M metric can use information about the magnitude and the phase of the constellation points, the trellis block size, and the characteristics of the channel to calculate the soft-decision distance. M can be adjusted by means of its parametric constants for knowledge of stochastic distributions of the phase rotations introduced by the channel and the receiving equipment. Hence, the M metric allows the system to "distort" the unit circle to reflect the probability of phase rotation of a given Euclidean distance.

In embedded systems, including many modems and error correction systems, processing power is limited by the number and type of microprocessors in the system. For cost, power, and space savings, it is important in these systems to be able to execute as many functions in one microprocessor as possible. The M metric is well suited to digital signal processor (DSP) implementation because of its reliance on additions and multiplications.

In one implementation, the performance of the standard Euclidean metric (one-dimensional distance) was compared to the performance of a system using the M metric with coefficients chosen by the method described above. The M metric produced as much as a 250% BER improvement over the Euclidean metric. Obviously, the soft-decision metric chosen can greatly influence the performance of the decoder.

A general-purpose microprocessor for the system is pictured in the block diagram above, FIG. 1. The system sample rate is 38.4 kHz. As an example application consider the following scenario.

The test data sequence was generated. The block size (number of bits per trellis block encoded) is 48, block 60.

A data sequence was generated randomly, block 62.

The data were encoded by the trellis state machine, block 64. The system has sixteen possible constellation point pairs, requiring a trellis state machine with sixteen states. Constellation points in the pairs are represented as the integers −3, −1, 1, and 3. The constellation pairs output for each transition are as follows:

| Input | Output for Current State | | | |
|---|---|---|---|---|
| | 00 | 01 | 10 | 11 |
| 00 | (−3,1) | (3,−1) | (−3,−3) | (3,3) |
| 01 | (−3,−3) | (3,3) | (3,−1) | (−3,1) |
| 10 | (−1,−1) | (1,1) | (−1,3) | (1,−3) |
| 11 | (1,−3) | (−1,3) | (−1,−1) | (1,1) |

The state machine was initialized to state zero, block 66. The input data were used as the state transitions for the state machine (the input is used as the next state), block 68. The constellation pair associated with each state transition is the trellis output for the input data sequence, these constellation pairs forming the input sequence to the modulation state machine.

The encoded data were modulated, block 70:

The following state transition/output table describes the modulation state machine for the system:

| | Next State/Output for Current State | | | | | | | |
|---|---|---|---|---|---|---|---|---|
| Input | 0 | 1 | 2 | 3 | 4 | 5 | 6 | 7 |
| -3 | 1<br>($\sqrt{2}$, $\sqrt{2}$) | 2<br>(0, 1) | 3<br>(-$\sqrt{2}$, $\sqrt{2}$) | 4<br>(-1, 0) | 5<br>(-$\sqrt{2}$, -$\sqrt{2}$) | 6<br>(0, -1) | 7<br>($\sqrt{2}$, -$\sqrt{2}$) | 0<br>(1, 0) |
| -1 | 3<br>(-$\sqrt{2}$, $\sqrt{2}$) | 4<br>(-1, 0) | 5<br>(-$\sqrt{2}$, -$\sqrt{2}$) | 6<br>(0, -1) | 7<br>($\sqrt{2}$, -$\sqrt{2}$) | 0<br>(1, 0) | 1<br>($\sqrt{2}$, $\sqrt{2}$) | 2<br>(0, 1) |
| 1 | 7<br>($\sqrt{2}$, -$\sqrt{2}$) | 0<br>(1, 0) | 1<br>($\sqrt{2}$, $\sqrt{2}$) | 2<br>(0, 1) | 3<br>(-$\sqrt{2}$, $\sqrt{2}$) | 4<br>(-1, 0) | 5<br>(-$\sqrt{2}$, -$\sqrt{2}$) | 6<br>(0, -1) |
| 3 | 5<br>(-$\sqrt{2}$, -$\sqrt{2}$) | 6<br>(0, -1) | 7<br>($\sqrt{2}$, -$\sqrt{2}$) | 0<br>(1, 0) | 1<br>($\sqrt{2}$, $\sqrt{2}$) | 2<br>(0, 1) | 3<br>(-$\sqrt{2}$, $\sqrt{2}$) | 4<br>(-1, 0) |

Symbols from the encoded data sequence were used to transition through the state machine to generate the I and Q portions of the output signal, block 72. A modified raised cosine filter with passband edge at 2400 Hz was used to filter the modulated data, block 74.

Channel effects are simulated on the digital samples. A channel model was defined as Gaussian noise, specified by the signal-to-noise ratio (SNR), block 76. SNR was varied to generate the different test cases. 100 dB SNR was used for finding the coefficients. The Gaussian noise was inserted into the channel additively, block 78.

Data is demodulated and converted into constellation points. A wide IF filter with passband edge at 4800 Hz was used to low-pass filter the I and Q portions of the data, block 80. A differential arctangent was used on the data to undo the differential effects of the modulator, block 82. An integrate and dump filter was used to filter the output of the differential arctangent, block 84. The integrate and dump filter consists of the sum of eight consecutive samples, delayed by four samples. The symbol recovery loop was performed, block 86. The magnitude of the quadrature signals was delayed by a Gaussian delay filter to match the adjusted symbol phase delay in the symbol recovery loop, block 88.

The coefficients for M are initialized. Initial values for $a_3$, $a_4$, and $a_5$ were chosen arbitrarily to be 32 and $a_2$ was chosen arbitrarily to be -100 block 90. The resulting values of $a_0$, $a_1$, and G were generated from these to satisfy the constraints: $a_0=18.05$, $a_1=0.42$, $G=-10^{-9}$.

Trellis decoding is performed using the current coefficients. A trellis diagram was constructed for the data with four rows and eighteen columns (one for each of sixteen bit pairs, and one for each of the end states), block 92. The M metric was calculated for each state transition, block 94. The E metric is calculated for each state transition, block 96. A Viterbi search was used to traverse the least-cost path in the trellis diagram from its end state (zero) to its start state (zero), block 98.

The result of trellis decoding is evaluated. The decoded data were compared to the test data sequence, block 100. The number of bits which differed between the test sequence and the decoded sequence were counted, block 102. The number of bits which differed was divided by the block size to calculate the percentage of bit errors. The performance of M was compared to that of the baseline, E, block 104. The performance of M (42%) was unfavorable against that of E (27%), block 106.

Since the coefficients needed to be perturbed, the following steps are performed. Coefficient $a_2$ was perturbed by -10 to a value of 22, block 108. The values of $a_0$, $a_1$, and G were updated to satisfy the constraints: $a_0=3.796+7.528i$, $a_1=3.796-7.528i$, $G=-10^{-9}$, block 110. (Note that because the complex coefficients $a_0$ and $a_1$ are used in a product of sums, and because the coefficients are complex conjugates of each other, the product of their sums contains only real numbers.)

Trellis decoding is performed using the current coefficients. A trellis diagram was constructed for the data with four rows and eighteen columns (one for each of sixteen bit pairs and one for each of the end states), block 92. The M metric was calculated for each state transition, block 94. The E metric is calculated for each state transition, block 96. A Viterbi search was used to traverse the least-cost path in the trellis diagram from its end state (zero) to its start state (zero), block 98.

The result of trellis decoding is evaluated. The decoded data were compared to the test data sequence, block 100. The number of bits which differed between the test sequence and the decoded sequence were counted, block 102. The number of bits which differed was divided by the block size to calculate the percentage of bit errors. The performance of M was compared to that of the baseline, E, block 104. The performance of M (13%) was favorable against that of E (27%), block 106.

Since the coefficients did not need to be perturbed, the following step is performed. The resulting set of coefficients was installed in the system, block 112.

| Coefficient | Value |
|---|---|
| $a_0$ | 3.796+7.528i |
| $a_1$ | 3.796-7.528i |
| $a_2$ | 22 |
| $a_3$ | 32 |
| $a_4$ | 32 |
| $a_5$ | 32 |
| G | $-10^{-9}$ |

The following table summarizes the error rate performance of the simulations with the chosen coefficients:

| Channel Model | E bit errors | M bit errors |
|---|---|---|
| 0 dB SNR, Gaussian noise | 44% | 44% |
| 20 dB SNR, Gaussian noise | 42% | 38% |
| 40 dB SNR, Gaussian noise | 40% | 31% |
| 60 dB SNR, Gaussian noise | 38% | 15% |
| 80 dB SNR, Gaussian noise | 33% | 13% |
| 100 dB SNR, Gaussian noise | 27% | 13% |

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A method for a soft-decision modulation system, said soft-decision modulation system including a transmitter and a receiver, said soft-decision modulation system including a processor for performing said method, said method comprising the steps of:

said transmitter performing the steps of:
  encoding original data by a trellis encoder to produce encoded data;
  modulating by a modulator said encoded data to produce modulated data; and
  transmitting said modulated data;

said receiver performing the steps of:
  recovering symbols representing said original data from said modulated data;
  selecting values for a set of coefficients;
  decoding via a trellis decoder said symbols with said set of coefficients to produce new data approximating said original data;
  evaluating a bit error rate of said new data for determining acceptable performance of said decoding step; and
  adjusting said values of said set of coefficients, if said performance is unacceptable.

2. A method for a soft-decision modulation system as claimed in claim 1, wherein said transmitter further performs the steps of:
  choosing a number of bits per trellis block encoded;
  generating a pseudo-noise data sequence; and
  encoding said original data with said pseudo-noise data sequence to produce said encoded data.

3. A method for a soft-decision modulation system as claimed in claim 2, wherein said step of modulating further includes the step generating in-phase (I) and quadrature (Q) portions of said modulated data.

4. A method for a soft-decision modulation system as claimed in claim 3, wherein said transmitter further performs the step of low-pass filtering said in-phase (I) and quadrature (Q) portions of said modulated data.

5. A method for a soft-decision modulation system as claimed in claim 4, wherein said receiver further performs the steps of:
  receiving said modulated data including said in-phase (I) and quadrature (Q) portions; and
  demodulating said modulated data.

6. A method for a soft-decision modulation system as claimed in claim 5, wherein said step of demodulating includes the steps of:
  low-pass filtering said modulated data to produce filtered data;
  applying an arctangent function to said in-phase (I) and quadrature (Q) portions of said filtered data to produce an arctangent output; and
  integrate and dump filtering said arctangent output.

7. A method for a soft-decision modulation system as claimed in claim 6, wherein said recovering step includes the steps of:
  determining an error for said symbols for conversion to constellation points to produce adjusted symbols;
  tracking a DC offset voltage for each of said symbols;
  tracking a gain for constant quantization for each of said symbols; and
  generating a data rate clock for said symbols and a fine phase offset.

8. A method for a soft-decision modulation system as claimed in claim 7, wherein said receiver further performs the step of delaying said low-pass filtered modulated data.

9. A method for a soft-decision modulation system as claimed in claim 8, wherein said step of selecting values includes the steps of:

arbitrarily choosing initial values for coefficients $a_2$, $a_3$, $a_4$ and $a_5$; and choosing values of coefficients $a_0$, $a_1$ and G to satisfy the constraints:

$$x = \frac{8\,(p_1 - p_0)^2}{\pi^2}$$

$$(x = 0) \lor (x = 32) \to M(x) = 0$$
$$x = 8 \to M(x) = A$$

$$\left(x = \frac{1}{2}\right) \lor (x = 18) \to M(x) = B, A > B > 0$$

; and $$M(x) \geq 0, x \in [0,32]$$

$$\frac{d}{dx} M(x) \geq 0, x \in [0,8]$$

$$\frac{d}{dx} M(x) \leq 0, x \in [8,32]$$

; and $$M(x, m_1) = \begin{cases} Gm_1 x(x-32) \prod_{n=0}^{5} (x - a_n), & m_1 \neq 0 \\ A, & m_1 = 0 \end{cases}$$

define $$\alpha(b_0,b_1,b_2,b_3,b_4,b_5) = b_0 \pi\, a_i = b_i \sum_{i \neq j \neq k \neq l} a_i a_j a_k a_l - b_5 +$$

$$b_2 \sum_{i \neq j \neq k} a_i a_j a_k - b_3 \sum_{i \neq j} a_i a_j + b_4 \Sigma a_i$$

$$a_0(a_1,a_2,a_3,a_4,a_5) =$$

$$\frac{1}{2} \frac{\alpha(3680, 66352, 1194392, 21499084, 386983526, 6965703475)}{\alpha(96, 1840, 33176, 597196, 10749542, 193491763)}$$

also, $$a_0(a_1,a_2,a_3,a_4,a_5) = 4\,\frac{\alpha(5, 64, 704, 7168, 69632, 655360)}{\alpha(1, 20, 256, 2816, 28672, 278528)}$$

where M(x) is a soft-decision metric (an M metric) and A and B are constants.

10. A method for a soft-decision modulation system as claimed in claim 9, wherein said decoding step includes the step of constructing a trellis diagram for said adjusted symbols to produce decoded original data.

11. A method for a soft-decision modulation system as claimed in claim 10, wherein said decoding step further includes the step of calculating an M metric for a state transition of said trellis diagram for finding a distance between said adjusted symbols and a constellation pair which corresponds to said state transition.

12. A method for a soft-decision modulation system as claimed in claim 11, wherein said decoding step further includes the step of calculating a Euclidean metric (an E metric) for each state transition in said trellis diagram.

13. A method for a soft-decision modulation system as claimed in claim 12, wherein said decoding step includes the step of performing a Viterbi search to find a least cost path in said trellis diagram.

14. A method for a soft-decision modulation system as claimed in claim 13, wherein said evaluating step includes the steps of:
- comparing said decoded original data to a test data sequence; and
- determining a bit error rate for a trellis block.

15. A method for a soft-decision modulation system as claimed in claim 14, wherein said evaluating step includes the step of comparing said M metric to said E metric.

16. A method for a soft-decision modulation system as claimed in claim 15, wherein said adjusting step includes the steps of, if M is less than E:
- changing by relatively small values coefficients $a_2$, $a_3$, $a_4$ and $a_5$; and
- generating values of coefficients $a_0$, $a_1$ and G to satisfy constraints:

$$x = \frac{8(p_1 - p_0)^2}{\pi^2}$$

$$(x = 0) \lor (x = 32) \Rightarrow M(x) = 0$$
$$x = 8 \Rightarrow M(x) = A$$

$$\left(x = \frac{1}{2}\right) \lor (x = 18) \Rightarrow M(x) = B, A > B > 0$$

; and $$M(x) \geq 0, x \in [0, 32]$$

$$\frac{d}{dx} M(x) \geq 0, x \in [0, 8]$$

$$\frac{d}{dx} M(x) \leq 0, x \in [8, 32]$$

; and $$M(x, m_1) = \begin{cases} Gm_1 x(x-32) \prod_{n=0}^{5} (x - a_n), & m_1 \neq 0 \\ A, & m_1 = 0 \end{cases}$$

define $$\alpha(b_0, b_1, b_2, b_3, b_4, b_5) = b_0 \pi \, a_i = b_i \sum_{i \neq j \neq k \neq l} a_i a_j a_k a_l - b_5 +$$

$$b_2 \sum_{i \neq j \neq k} a_i a_j a_k - b_3 \sum_{i \neq j} a_i a_j + b_4 \Sigma a_i$$

$$a_0(a_1, a_2, a_3, a_4, a_5) =$$

-continued $$\frac{1}{2} \frac{\alpha(3680, 66352, 1194392, 21499084, 386983526, 6965703475)}{\alpha(96, 1840, 33176, 597196, 10749542, 193491763)}$$

also, $$a_0(a_1, a_2, a_3, a_4, a_5) = 4 \frac{\alpha(5, 64, 704, 7168, 69632, 655360)}{\alpha(1, 20, 256, 2816, 28672, 278528)}.$$

17. A method for a soft-decision modulation system as claimed in claim 16, wherein there is further included the step of iterating said steps of decoding, evaluating and adjusting, if M is less than E.

18. A method for a soft-decision modulation system as claimed in claim 17, wherein there is further included the step of installing in said soft-decision modulation system said values of said set of coefficients, if M is greater than or equal to E.

19. A method for a soft-decision modulation system, said soft-decision modulation system including a transmitter and a receiver, said soft-decision modulation system including a processor for performing said method, said method comprising the steps of:
said transmitter performing the steps of:
- encoding original data by a trellis decoder to produce encoded data;
- modulating by a modulator said encoded data to produce modulated data; and
- transmitting said modulated data;

said receiver performing the steps of:
- recovering symbols representing said original data from said modulated data;
- selecting values for a set of coefficients;
- decoding via a trellis decoder said symbols with said set of coefficients to produce new data approximating said original data;
- evaluating a bit error rate of said new data for determining acceptable performance of said decoding step;
- adjusting said values of said set of coefficients, if said performance is unacceptable;
- iterating said steps of decoding, evaluating and adjusting if said performance is unacceptable; and
- installing in said soft-decision modulation system said values of said set of coefficients, if said performance is acceptable.

* * * * *